(12) United States Patent
Kuo et al.

(10) Patent No.: US 11,087,833 B2
(45) Date of Patent: Aug. 10, 2021

(54) POWER MANAGEMENT CIRCUIT IN MEMORY DEVICE

(71) Applicant: Taiwan Semiconductor Manufacturing Co., Ltd., Hsinchu (TW)

(72) Inventors: Chia-Chen Kuo, Hsinchu (TW); Cheng-Hung Lee, Hsinchu (TW); Chi-Ting Cheng, Taichung (TW); Hua-Hsin Yu, Hsinchu (TW); Wei-Jer Hsieh, Hsinchu (TW); Yu-Hao Hsu, Tainan (TW); Yang-Syu Lin, New Taipei (TW); Che-Ju Yeh, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/907,328

(22) Filed: Jun. 22, 2020

(65) Prior Publication Data
US 2021/0125662 A1    Apr. 29, 2021

Related U.S. Application Data

(60) Provisional application No. 62/927,135, filed on Oct. 29, 2019.

(51) Int. Cl.
*G11C 5/14* (2006.01)
*G11C 11/417* (2006.01)
*G11C 11/412* (2006.01)

(52) U.S. Cl.
CPC ............ *G11C 11/417* (2013.01); *G11C 5/144* (2013.01); *G11C 5/148* (2013.01); *G11C 11/412* (2013.01)

(58) Field of Classification Search
CPC ....... G11C 5/144; G11C 5/148; G11C 11/417; G11C 11/412
See application file for complete search history.

(56) References Cited

U.S. PATENT DOCUMENTS

| | | | |
|---|---|---|---|
| 2008/0062802 A1* | 3/2008 | Lin ........................ | G11C 11/413 365/227 |
| 2009/0040859 A1* | 2/2009 | Zanders ................. | G11C 5/143 365/229 |
| 2010/0254206 A1* | 10/2010 | Campbell ................ | G11C 8/08 365/203 |

(Continued)

*Primary Examiner* — Khamdan N. Alrobaie
(74) *Attorney, Agent, or Firm* — JCIPRNET

(57) ABSTRACT

A power management circuit suitable for a memory device and a memory device is provided. The power management circuit includes a first logic circuit, a second logic circuit, and a transmission gate. The first logic circuit is configured to receive an inverted first input signal and a second input signal and generates a first output signal. The second logic circuit is configured to receive a first input signal and the second input signal and generates a second output signal. The transmission gate is configured to receive the first output signal and generates a control signal to at least one power transistor coupled between the power management circuit and the memory device. During a standby mode, the power transistor is turned on to make a first voltage equal to a predetermined voltage and during a sleep mode, the control signal is coupled to a first voltage. The predetermined voltage is greater than the first voltage.

20 Claims, 9 Drawing Sheets

(56) References Cited

U.S. PATENT DOCUMENTS

| | | | |
|---|---|---|---|
| 2014/0126278 A1* | 5/2014 | Nii | G11C 11/419 |
| | | | 365/154 |
| 2018/0246662 A1* | 8/2018 | Kim | G11C 5/04 |
| 2020/0020361 A1* | 1/2020 | Jain | G11C 11/417 |
| 2020/0043531 A1* | 2/2020 | Earle | G11C 11/417 |

* cited by examiner

POWER MANAGEMENT CIRCUIT IN MEMORY DEVICE

CROSS-REFERENCE TO RELATED APPLICATION

This application claims the priority benefit of U.S. provisional application Ser. No. 62/927,135, filed on Oct. 29, 2019. The entirety of the above-mentioned patent application is hereby incorporated by reference herein and made a part of this specification.

BACKGROUND

In a memory device, a power management circuit is required for controlling the switching between different power management modes such as, a standby mode, a sleep mode, and a shutdown mode. An approach is to use to turn off a header transistor of the memory device during the shutdown mode and to enable a retention diode of the memory device during the sleep mode for reducing the voltage requirement during the sleep mode. By this approach, a shutdown leakage of the header transistor and the retention diode is occurred during the shutdown mode. In addition, by using header transistor and the retention diode to control the switching between different power management modes in the memory device, an area overhead of the memory device is correspondingly increased.

Therefore, there is a need to design the minimum shutdown leakage in the power management circuit of the memory device with small area overhead.

BRIEF DESCRIPTION OF THE DRAWINGS

Aspects of the present disclosure are best understood from the following detailed description vs h d with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
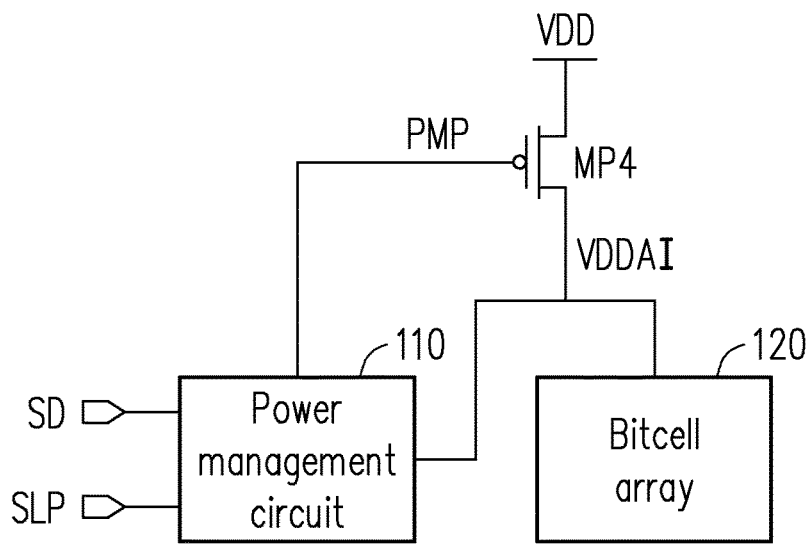
FIG. 1A illustrates a block diagram of a memory device according to an exemplary embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a block diagram of a memory device according to an exemplary embodiment of the disclosure. The memory device 100 includes a power management circuit 110, a bit cell array 120, and a power transistor MP4.

The memory device 100 is a Dynamic Random Access Memory (DRAM) device, and the memory device 100 is compatible with Joint Electron Device Engineering Council (JEDEC) standard.

In one embodiment, the memory device 100 is a SRAM device.

In some embodiments, the memory device 100 is a memory device with different power management modes, such as, a standby mode, a sleep mode, and a shutdown mode. Thus, the type of memory device 100 is not limited in this disclosure.

The power management circuit 110 is coupled to the bit cell array 120. The power management circuit 110 is used for controlling the switching between different power management modes. The power management modes include a standby mode, a sleep mode, a shutdown mode. In the standby mode, is also known as a normal operating mode, the power management circuit 110 not reducing a voltage level of the bit cell array 120 during the standby mode. In the shutdown mode, the voltage level of the bit cell array 120 is completely cut off for the maximum leakage reduction. In the sleep mode, the voltage level is reduced to a voltage level lower than the supply voltage, that is a first voltage VDDAI to reduce leakage of the power transistor MP4. It is noted that the data stored in the bit cell array 120 is retained in the sleep mode.

The power management circuit 110 controls the power transistor MP4 according to a plurality of power management signals. It is noted that, the power management circuit 110 controls the voltage when the memory device operates in sleep mode or the shutdown mode to reduce the power consumption of the memory device 100. The power management signals include a shutdown signal SD and a sleep signal SLP.

The bit cell array 120 includes a plurality of bit cells in the memory device 100.

In one embodiment, the bit cell array 120 is a SRAM bit cell array if the SRAM memory device is used. It is noted that, the type of bit cell array 120 is determined according to the type of the memory device.

The power transistor MP4 is a PMOS transistor. The power transistor MP4 includes a source terminal, a control terminal, and a drain terminal. The source terminal is coupled to a predetermined voltage VDD. The predetermined voltage VDD is a power supply voltage of the memory device 100. The control terminal is coupled to an output node of the power management circuit 110. In other words, the control terminal receives a control signal PMP from the power management circuit 110. The drain terminal is coupled to the bit cell array 120.

With reference to FIG. 1A, during the standby mode, the power transistor MP4 is turned on according to the control signal PMP to make the first voltage VDDAI equal to the predetermined voltage VDD. The first voltage VDDAI is the voltage after the voltage drop in the power transistor MP4. In other words, the predetermined voltage VDD is greater than the first voltage VDDAI. On the other hand, the first voltage VDDAI is greater than the ground potential. During the shutdown mode, the control signal PMP from the power management circuit 110 turns off the power transistor MP4.

During the sleep mode, the control signal PMP is coupled to the first voltage VDDAI.

Figure 1B:
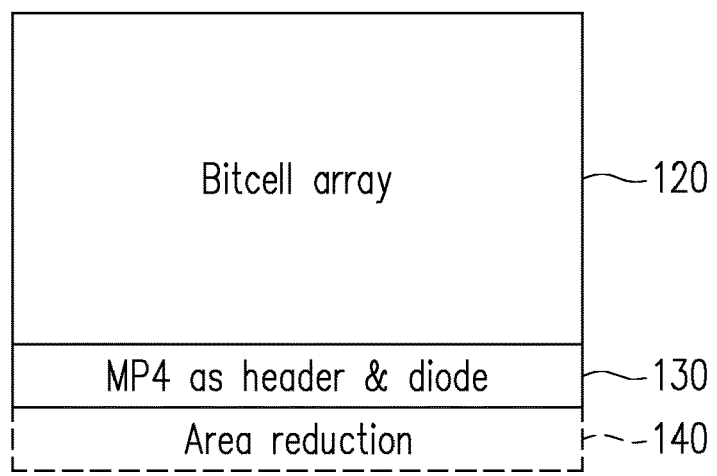
FIG. 1B illustrates a layout of a memory device according to an exemplary embodiment of the disclosure.

With reference to FIG. 1B, illustrates a layout of a memory device according to an exemplary embodiment of the disclosure. The memory device 100 includes a bit cell array 120 and a power transistor MP4. The bit cell array 120 and the power transistor MP4 in FIG. 1A are similar to the bit cell array 120 and the power transistor MP4 in FIG. 1, thus the detailed descriptions of the bit cell array 120 and the power transistor MP4 are omitted herein.

It is noted that, the power transistor MP4, which is a PMOS transistor, behaves as a header transistor and a retention diode by controlling the control signal PMP by the power management circuit 110 to switch between the different power management modes. The area of the retention diode is reduced as shown in area reduction 140.

Figure 2:
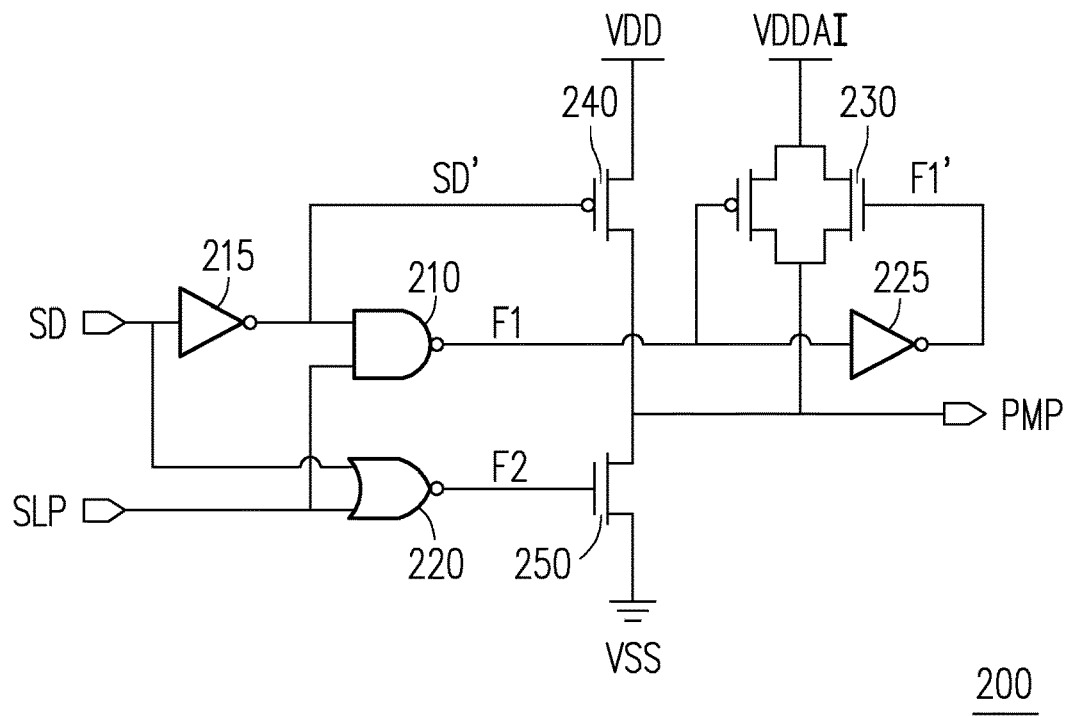
FIG. 2 illustrates a power management circuit of a memory device according to an exemplary embodiment of the disclosure.

FIG. 2 illustrates a power management circuit of a memory device according to an exemplary embodiment of the disclosure. The power management circuit 200 of FIG. 2 is implemented as the power management circuit 110 of FIG. 1A. The power management circuit 200 includes a logic circuit 210, a logic circuit 220, a transmission gate 230, a CMOS transistor 240, a CMOS transistor 250, an inverter 215, and an inverter 225.

The logic circuit 210 is a 2-input NAND gate. The logic circuit 210 is configured to receive an inverted shutdown signal SD' and a sleep signal SLP to generate an output signal F1.

The logic circuit 220 is a 2-input NOR gate. The logic circuit 220 is configured to receive a shutdown signal SD and a sleep signal SLP to generate an output signal F2. It is noted that, the logic circuit 210 and the logic circuit 220 may be an AND gate, an OR, a NOT, an EXOR, an EXNOR, a Flip flop or different combination of logic gates, thus the type of the logic circuit 210 and the logic circuit 220 is not limited in this disclosure.

The inverter 215 is coupled to the logic circuit 210. The inverter 215 is configured to receive the shutdown signal and generates the inverter shutdown signal SD'. Similarly, the inverter 225 is coupled to the logic circuit 210. The inverter 225 is configured to receive the output signal F1 and generates an inverted output signal F1'.

With reference to FIG. 1, the transmission gate 230 is configured to receive the output signal F1 and generates a control signal PMP to the power transistor MP4 coupled between the power management circuit 110 and the memory device 100.

The transmission gate 230 is configured to the output signal F1 and generates a control signal PMP to the power transistor MP4. The transmission gate 230 includes an input terminal, an output terminal, a control terminal and a complimentary control terminal. The input terminal of the transmission gate 230 is coupled to a first voltage VDDAI. The output terminal of the transmission gate 230 is coupled to the output node of the power management circuit 200. The control terminal of the transmission gate 230 is coupled to the inverter 225. To be specific, control terminal of the transmission gate 230 receives the inverted output signal F1' from the inverter 225. The complementary control terminal of the transmission gate 230 is coupled to the logic circuit 210. In detail, the complementary control terminal of the transmission gate 230 receives the output signal F1 from the logic circuit 210.

The CMOS transistor 240 is a PMOS transistor. The CMOS transistor 240 includes a source terminal, a control terminal, and a drain terminal. The source terminal of the CMOS transistor 240 is coupled to a predetermined voltage VDD. The control terminal of the CMOS transistor 240 is coupled to the inverter 215. In detail, the control terminal of the CMOS transistor 240 is configured to receive the inverted shutdown signal as a control signal to drive the CMOS transistor 240. The drain terminal is coupled to the output node of the power management circuit 200.

In some embodiments, the CMOS transistor 240 may be a NMOS transistor and the circuit configuration is based on the type of the CMOS transistor, thus the type of the CMOS transistor 240 is not limited in this disclosure.

The CMOS transistor 250 is a NMOS transistor. The CMOS transistor 250 includes a source terminal, a control terminal, and a drain terminal. The source terminal of the CMOS transistor 250 is coupled a ground potential VSS. The control terminal of the CMOS transistor 250 is coupled the logic circuit 220. In detail, the control terminal of the CMOS transistor 250 is configured to receive the output signal F2 as a control signal to drive the CMOS transistor 250. The drain terminal of the CMOS transistor 250 is coupled to the drain terminal of the CMOS transistor 240. In other words, the drain terminal of the CMOS transistor 250 is coupled to the output node of the power management circuit 200.

In some embodiments, the CMOS transistor 250 may be a PMOS transistor and the circuit configuration is based on the type of the CMOS transistor, thus the type of the CMOS transistor 250 is not limited in this disclosure.

With reference to FIG. 1, during a standby mode, the power transistor MP4 is turned on to make a first voltage VDDAI equal to the predetermined voltage VDD. During a sleep mode, the control signal PMP is coupled to the first voltage VDDAI. During a shutdown mode, the control signal PMP turns off the power transistor MP4.

Figure 3:
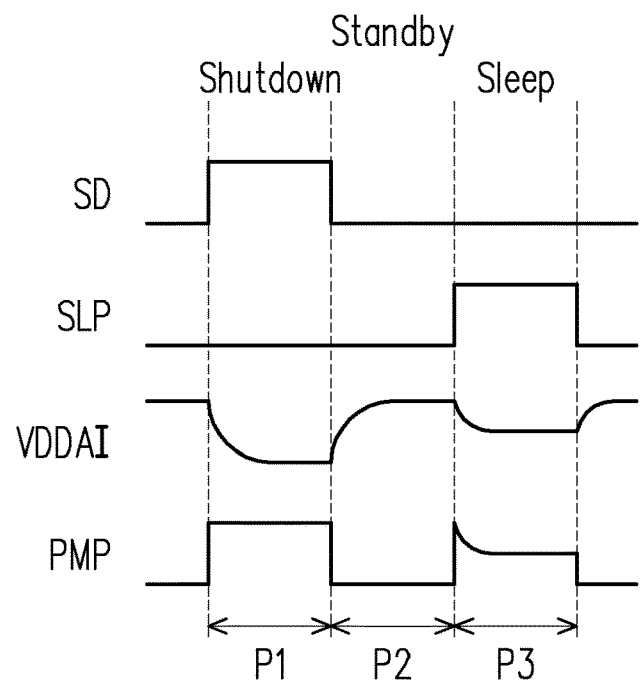
FIG. 3 illustrates a timing diagram of a memory device according to an exemplary embodiment of the disclosure.

FIG. 3 illustrates a timing diagram of a memory device according to an exemplary embodiment of the disclosure. The horizontal axis of the diagram shown in FIG. 3 illustrates the time and the vertical axis of the FIG. 3 illustrates a voltage variation corresponds to different power management modes with respect to a plurality of control signals in the memory device.

With reference to FIG. 1, FIG. 2 and FIG. 3, during a shutdown mode in a period P1, a shutdown signal SD goes from logic low 0 to logic high 1 and a sleep signal SLP remains logic low 0. In this period P1, a control signal PMP goes from logic low 0 to logic high 1 to turn off a power transistor MP4 and a supply voltage to the bit cell array 120 is completely cut off at this period for maximum leakage reduction. In this period P1, a data stored in the bit cell array 120 is lost.

On the other hand, during a standby mode in a period P2, the shutdown signal SD goes logic high 1 to logic low 0 and the sleep signal SLP remains logic low 0. In this period P2, the control signal PMP goes from logic high 1 to logic low 0 to turn on the power transistor MP4 and the supply voltage to the bit cell array 120 goes from ground potential to a predetermined voltage VDD. In other words, during the period P2, the power transistor MP4 is turned on to make a first voltage VDDAI equal to the predetermined voltage VDD.

During a sleep mode in a period P3, the shutdown signal SD remains in logic low 0 and the sleep signal SLP goes from logic low 0 to logic high 1. In other words, the sleep signal SLP is enabled during the period P3. After the sleep signal SLP is enabled, the control signal PMP is coupled to the first voltage VDDAI. In other words, the supply voltage to the bit cell array 120 is reduced from the predetermine voltage VDD to the first voltage VDDAI. In this mode, the power transistor MP4 behaves as a retention diode to reduce the supply voltage from the predetermine voltage VDD to the first voltage VDDAI.

The truth table of the memory device is shown in Table I. With reference to FIG. 3 and table I, during the shutdown mode in the period P1, the shutdown signal SD goes from logic low 0 to logic high 1 and the sleep signal is undefined or in logic low 0. It is noted that, during the shutdown mode, the power transistor MP4 is turned off for the maximum leakage reduction.

TABLE I

| | Shutdown signal SD | Sleep signal SLP | Control signal PMP |
|---|---|---|---|
| Standby mode | 0 | 0 | 0 |
| Sleep mode | 0 | 1 | VDDAI |
| Shutdown mode | 1 | X | 1 |

During the standby mode in the period P2, both the shutdown signal SD and the sleep signal SLP remains logic low 0. In other words, the control signal PMP goes from logic 1 to logic low 0 to turn on the power transistor MP4. The power transistor MP4 is turned on to make a first voltage VDAAI equal to the predetermined voltage VDD.

During the sleep mode in the period P3, the shutdown signal SD remains in logic low 0 and the sleep signal SLP goes from logic low 0 to logic high 1. In other words, the sleep signal SLP is enabled, the control signal PMP is coupled to the first voltage VDDAI. In this mode, the power transistor MP4 behaves as a retention diode to reduce the supply voltage from the predetermine voltage VDD to the first voltage VDDAI.

Figure 4A:
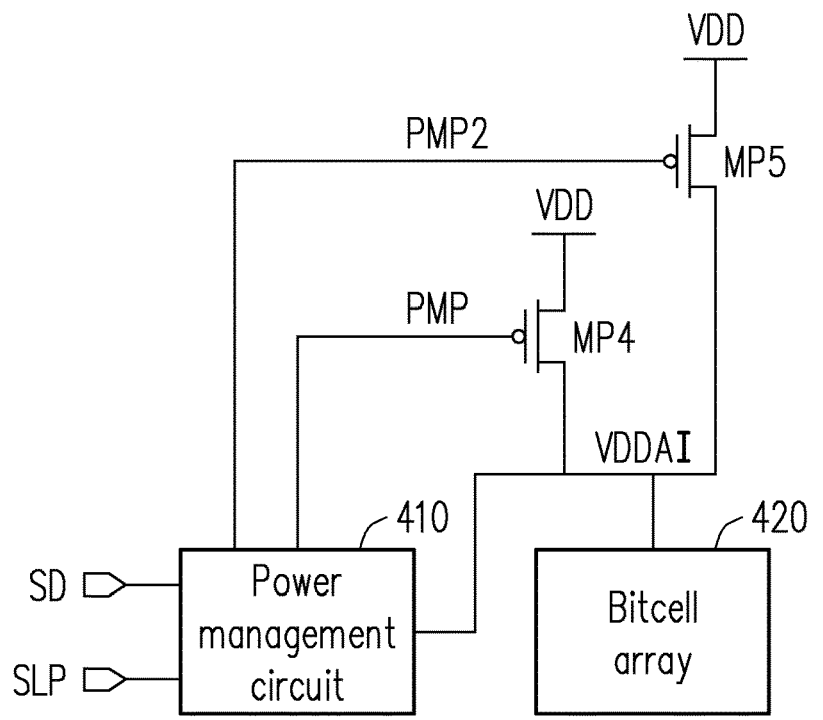
FIG. 4A illustrates a block diagram of a memory device according to an exemplary embodiment of the disclosure.

FIG. 4A illustrates a block diagram of a memory device according to an exemplary embodiment of the disclosure. The memory device 400 includes a power management circuit 410, a bit cell array 420, and a power transistor MP4 and a power transistor MP5.

The power management circuit 410 and the bit cell array 420 are respectively similar to a power management circuit 110 and a bit cell array 120 with reference to FIG. 1, thus the detailed description of the power management circuit 410 and the bit cell array 420 are omitted herein.

The power transistor MP4 is a PMOS transistor. The power transistor MP4 includes a source terminal, a control terminal, and a drain terminal. The source terminal of the power transistor MP4 is coupled to a predetermined voltage VDD. The predetermined voltage VDD is a power supply voltage of the memory device 400. The control terminal of the power transistor MP4 is coupled to a first output node of the power management circuit 410. In other words, the control terminal of the power transistor MP4 receives a control signal PMP from the power management circuit 410. The drain terminal of the power transistor MP4 is coupled to the bit cell array 420.

Similarly, the power transistor MP5 is a PMOS transistor. The power transistor MP5 includes a source terminal, a control terminal, and a drain terminal. The source terminal of the power transistor MP5 is coupled to a predetermined voltage VDD. The control terminal of the power transistor MP5 is coupled to a second output node of the power management circuit 410. In other words, the control terminal of the power transistor MP5 receives a control signal PMP2 from the power management circuit 410. The drain terminal of the power transistor MP5 is coupled to the bit cell array 420.

During a standby mode, the power transistor MP4 and the power transistor MP5 are turned on to make a first voltage VDDAI equal to the predetermined voltage VDD. The first voltage VDDAI is the voltage after the voltage drop in the power transistor MP4 and the power transistor MP5. In other words, the predetermined voltage VDD is greater than the first voltage VDDAI. On the other hand, the first voltage VDDAI is greater than the ground potential.

During the shutdown mode, the control signal PMP and the control signal PMP2 from the power management circuit 410 respectively turns off the power transistor MP4 and the power transistor MP5.

During the sleep mode, the control signal PMP is coupled to the first voltage VDDAI and the control signal PMP2 goes to logic high 1 to turn off the power transistor MP5. In detail, a retention level of a diode may be tuned by changing the ratio of the power transistor MP4 and the power transistor MP5. The retention level of the diode becomes higher as the ratio between the power transistor MP4 and the power transistor MP5 increases. By optimizing the ratio between the power transistor MP4 and the power transistor MP5, the sleep leakage is further minimized.

Figure 4B:
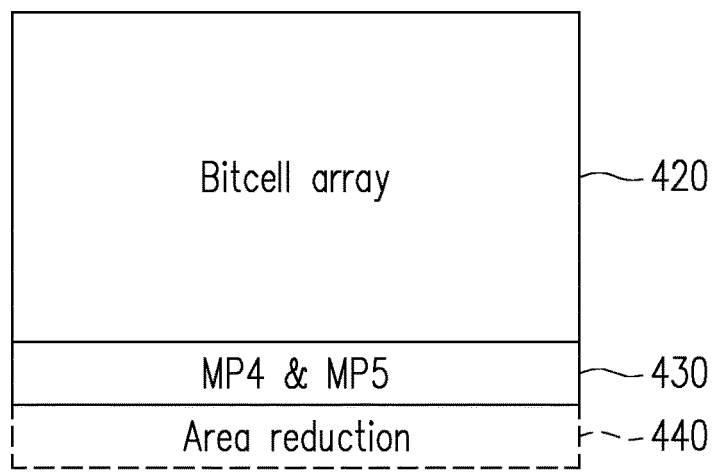
FIG. 4B illustrates a layout of a memory device according to an exemplary embodiment of the disclosure.

With reference to FIG. 4B, illustrates a layout of a memory device according to an exemplary embodiment of the disclosure. Same elements in FIG. 4B have a same reference numbers as the memory device shown in FIG. 4A. It is noted that an area of the power transistor 450 includes the power transistor MP4 and the power transistor MP5 with reference to FIG. 4A, thus the detailed descriptions of the bit cell array 420 and the power transistor 450 are omitted herein.

It is noted that, the power transistor MP4 and the power transistor MP5 behaves as a header transistor and a retention diode by controlling the control signal PMP and the control signal PMP2 by the power management circuit 410 to switch between the different power management modes, thereby an area of the retention diode is reduced as shown in area reduction 430.

Figure 5:
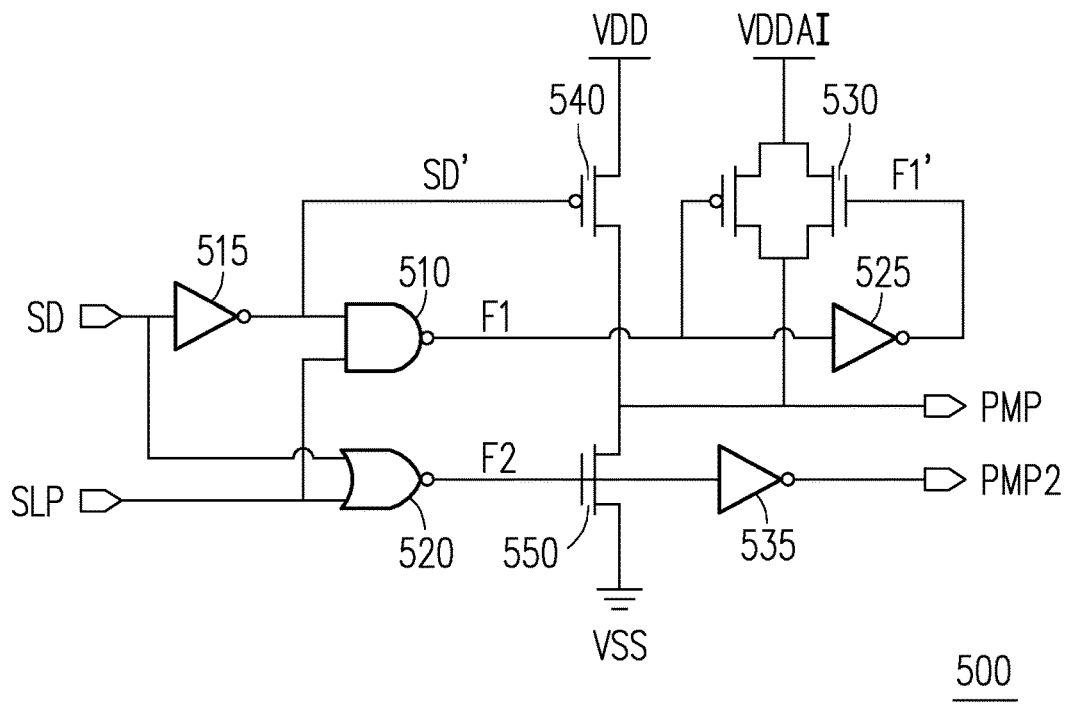
FIG. 5 illustrates a power management circuit of a memory device according to an exemplary embodiment of the disclosure.

FIG. 5 illustrates a power management circuit of a memory device according to an exemplary embodiment of the disclosure. The power management circuit 500 of FIG. 5 is implemented as the power management circuit 410 of FIG. 4A. The power management circuit 500 includes a logic circuit 510, a logic circuit 520, a transmission gate 530, a CMOS transistor 540, a CMOS transistor 550, an inverter 515, an inverter 525, and an inverter 535.

The logic circuit 510, the logic circuit 520, the transmission gate 530, the CMOS transistor 540, the CMOS transistor 550, the inverter 515, and the inverter 525 are respectively similar to a logic circuit 210, a logic circuit 220, a transmission gate 230, a CMOS transistor 240, a CMOS transistor 250, an inverter 215, and an inverter 225 with reference to FIG. 2, thus the detailed descriptions of the logic circuit 510, the logic circuit 520, the transmission gate 530, the CMOS transistor 540, the CMOS transistor 550, the inverter 515, and the inverter 525 are omitted herein.

With reference to FIG. 5 the transmission gate 530 is configured to receive an output signal F1 and generates a control signal PMP at a first output node of a power management circuit 410 to a power transistor MP4 and a power transistor MP5.

The CMOS transistor 540 is a PMOS transistor. The CMOS transistor 540 includes a source terminal, a control terminal, and a drain terminal. The source terminal of the CMOS transistor 540 is coupled to a predetermined voltage VDD. The control terminal of the CMOS transistor 540 is coupled to the inverter 515. In detail, the control terminal of the CMOS transistor 540 is configured to receive an inverted shutdown signal as a control signal to drive the CMOS transistor 540. The drain terminal is coupled to the first output node of the power management circuit 500.

The CMOS transistor 550 is a NMOS transistor. The CMOS transistor 550 includes a source terminal, a control terminal, and a drain terminal. The source terminal of the CMOS transistor 550 is coupled a ground potential VSS. The control terminal of the CMOS transistor 550 is coupled the logic circuit 520. In detail, the control terminal of the CMOS transistor 550 is configured to receive an output signal F2 as a control signal to drive the CMOS transistor 550. The drain terminal of the CMOS transistor 550 is coupled to the drain terminal of the CMOS transistor 540. In other words, the drain terminal of the CMOS transistor 550 is coupled to the first output node of the power management circuit 500. To be specific, the power management circuit 500 generates the control signal PMP at the first output node.

The inverter 535 is coupled to the logic circuit 520 and configured to generate a control signal PMP2. In detail, the inverter 535 receives the output signal F2 and generates the control signal PMP2 at a second output node of a power management circuit 500 to the power transistor MP5.

With reference to FIG. 4A and FIG. 5, during a standby mode, the power transistor MP4 and the power transistor MP5 are turned on according to the control signals PMP, PMP2 to make a first voltage VDDAI equal to a predetermined voltage VDD. During a shutdown mode, the control signal PMP and the control signal PMP2 from the power management circuit 410 are turned off the power transistor MP4 and the power transistor MP5.

During a sleep mode, the control signal PMP is coupled to the first voltage VDDAI and the control signal PMP2 goes to logic high 1 to turn off the power transistor MP5. In other words, a retention level of a diode may be tuned by changing the ratio of the power transistor MP4 and the power transistor MP5. The retention level of the diode becomes higher as the ratio between the power transistor MP4 and the power transistor MP5 increases. By optimizing the ratio between the power transistor MP4 and the power transistor MP5, the sleep leakage is further minimized.

Figure 6:
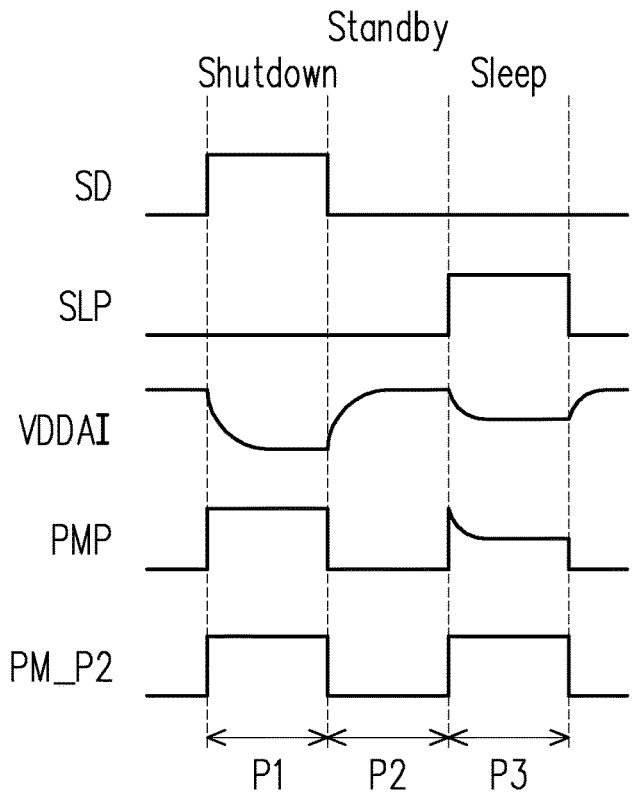
FIG. 6 illustrates a timing diagram of a memory device according to an exemplary embodiment of the disclosure.

FIG. 6 illustrates a timing diagram of a memory device according to an exemplary embodiment of the disclosure. The horizontal axis of the diagram shown in FIG. 6 illustrates the time and the vertical axis of the FIG. 6 illustrates a voltage variation corresponds to different power management modes with respect to a plurality of control signals in the memory device.

With reference to FIG. 4, FIG. 5 and FIG. 6, during a shutdown mode in a period P1, a shutdown signal SD goes from logic low 0 to logic high 1 and a sleep signal SLP remains logic low 0. In this period P1, a control signal PMP goes from logic low 0 to logic high 1 and the control signal PMP2 goes from logic low 0 to logic 1 to turn off a power transistor MP4 and a power transistor MP5. In the period P1, a supply voltage to the bit cell array 420 is completely cut off at this period for maximum leakage reduction. In this period P1, a data stored in the bit cell array 420 is lost.

On the other hand, during a standby mode in a period P2, the shutdown signal SD goes logic high 1 to logic low 0 and the sleep signal SLP remains logic low 0. In this period P2, the control signal PMP goes from logic high 1 to logic low 0 and the control signal PMP2 goes from logic high 1 to logic low 0 to turn on the power transistor MP4 and the power transistor MP5 and the supply voltage to the bit cell array 420 goes from ground potential to a predetermined voltage VDD. In other words, during the period P2, the power transistor MP4 and the power transistor MP5 are turned on to make a first voltage VDDAI equal to the predetermined voltage VDD.

During a sleep mode in a period P3, the shutdown signal SD remains in logic low 0 and the sleep signal SLP goes from logic low 0 to logic high 1. In other words, the sleep signal SLP is enabled during the period P3. After the sleep signal SLP is enabled, the control signal PMP is coupled to the first voltage VDDAI and the control signal PMP2 goes from logic low 0 to logic high 1. In other words, the supply voltage to the bit cell array 420 is reduced from the predetermine voltage VDD to the first voltage VDDAI by the power transistor MP4 and the power transistor MP5. In this sleep mode, the power transistor MP4 behaves as a retention diode to reduce the supply voltage from the predetermine voltage VDD to the first voltage VDDAI and the power transistor MP5 behaves as a header. In detail, a retention level of a diode may be tuned by changing the ratio of the power transistor MP4 and the power transistor MP5. The retention level of the diode becomes higher as the ratio between the power transistor MP4 and the power transistor MP5 increases. By optimizing the ratio between the power transistor MP4 and the power transistor MP5, the sleep leakage is further minimized.

The truth table of the memory device is shown in Table II, with reference to FIG. 4A, FIG. 6 and table II, during the shutdown mode in the period P1, the shutdown signal SD goes from logic low 0 to logic high 1 and the sleep signal SLP is undefined or remains logic low 0. It is noted that, during the shutdown mode, the power transistor MP4 and the power transistor MP5 is turned off for the maximum leakage reduction.

TABLE II

|  | Shutdown signal SD | Sleep signal SLP | Control signal PMP | Control signal PMP2 |
|---|---|---|---|---|
| Standby mode | 0 | 0 | 0 | 0 |
| Sleep mode | 0 | 1 | VDDAI | 1 |
| Shutdown mode | 1 | X | 1 | 1 |

During the standby mode in the period P2, both the shutdown signal SD and the sleep signal SLP remains logic low 0. In other words, both the control signal PMP and the control signal PMP2 goes from logic 1 to logic low 0 to turn on the power transistor MP4. In other words, during the period P2, the power transistor MP4 and the power transistor MP5 are turned on to make a first voltage VDDAI equal to the predetermined voltage VDD.

During the sleep mode in the period P3, the shutdown signal SD remains in logic low 0 and the sleep signal SLP goes from logic low 0 to logic high 1. In other words, the sleep signal SLP is enabled during the period P3. After the sleep signal SLP is enabled, the control signal PMP is coupled to the first voltage VDDAI and the control signal PMP2 goes from logic low 0 to logic high 1. In this sleep mode, the power transistor MP4 behaves as a retention diode to reduce the supply voltage from the predetermined voltage VDD to the first voltage VDDAI and the power transistor MP5 behaves as a header.

Figure 7:
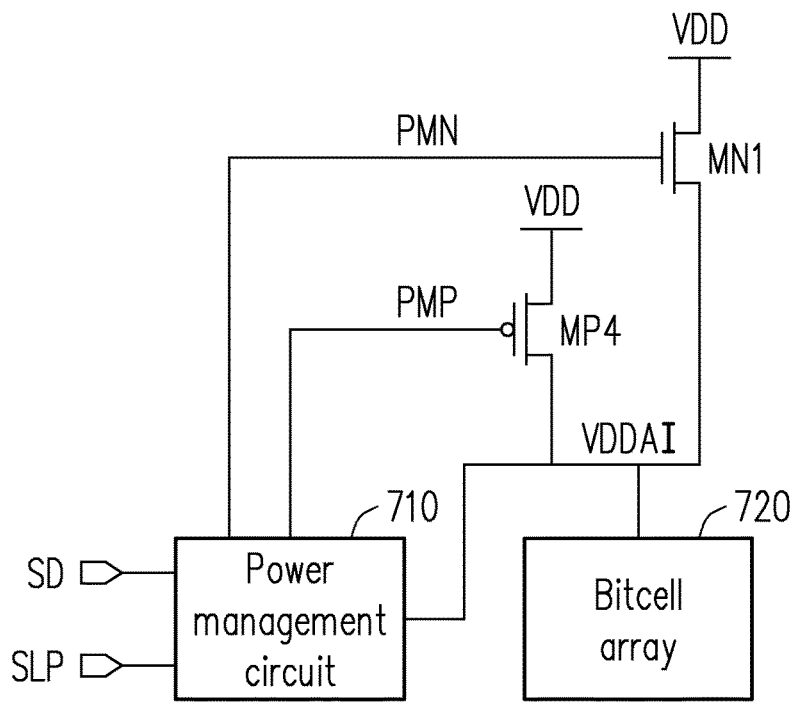
FIG. 7 illustrates a block diagram of a memory device according to an exemplary embodiment of the disclosure.

FIG. 7 illustrates a block diagram of a memory device according to an exemplary embodiment of the disclosure. The memory device 700 includes a power management circuit 710, a bit cell array 720, and a power transistor MP4, and a power transistor MN1.

The power management circuit 710 and the bit cell array 720 are respectively similar to a power management circuit 110 and a bit cell array 120 with reference to FIG. 1, thus the detailed description of the power management circuit 710 and the bit cell array 720 are omitted herein.

The power transistor MP4 is similar to the power transistor MP4 with reference to FIG. 4, thus the detailed description of the power transistor MP4 is omitted herein.

The power transistor MN1 is a NMOS transistor. The power transistor MN1 includes a source terminal, a control terminal, and a drain terminal. The source terminal of the power transistor MN1 is coupled to a predetermined voltage VDD. The control terminal of the power transistor MN1 is coupled to a second output node of the power management circuit 710. In other words, the control terminal of the power transistor MN1 receives a control signal PMN from the second output node of the power management circuit 710. The drain terminal of the power transistor MN1 is coupled to the bit cell array 720.

During a standby mode, the power transistor MP4 and the power transistor MN1 are turned on according to the control signals PMN, PMP to make a first voltage VDDAI equal to the predetermined voltage VDD. The first voltage VDDAI is the voltage after the voltage drop in the power transistor MP4 and the power transistor MN1. In other words, the predetermined voltage VDD is greater than the first voltage VDDAI. On the other hand, the first voltage VDDAI is greater than the ground potential.

During the shutdown mode, the control signal PMP and the control signal PMN from the power management circuit 710 respectively turns off the power transistor MP4 and the power transistor MN1.

During the sleep mode, the control signal PMP is coupled to the first voltage VDDAI and the control signal PMN remains in logic high 1 to turn on the power transistor MN1. It is noted that, both the power transistor MN1 and the power transistor MP4 behaves as a diode during the sleep mode.

Figure 8:
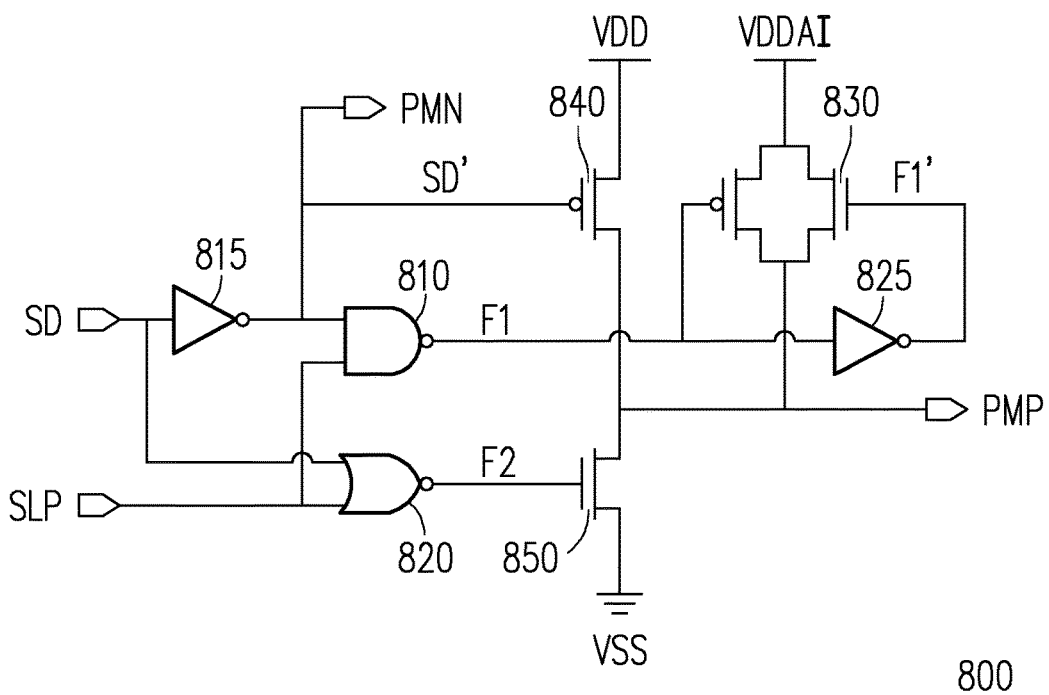
FIG. 8 illustrates a power management circuit of a memory device according to an exemplary embodiment of the disclosure

FIG. 8 illustrates a power management circuit of a memory device according to an exemplary embodiment of the disclosure. The power management circuit 800 includes a logic circuit 810, a logic circuit 820, a transmission gate 830, a CMOS transistor 840, a CMOS transistor 850, an inverter 815, and an inverter 825.

The logic circuit 810, the logic circuit 820, the transmission gate 830, the CMOS transistor 840, the CMOS transistor 850, the inverter 815, and the inverter 825 are respectively similar to a logic circuit 210, a logic circuit 220, a transmission gate 230, a CMOS transistor 240, a CMOS transistor 250, an inverter 215, and an inverter 225 with reference to FIG. 2, thus the detailed descriptions of the logic circuit 810, the logic circuit 820, the transmission gate 830, the CMOS transistor 840, the CMOS transistor 850, the inverter 815, and the inverter 825 are omitted herein.

With reference to FIG. 7 and FIG. 8, the transmission gate 830 is configured to receive an output signal F1 and generates a control signal PMP at a first output node of a power management circuit 810 to a power transistor MP4.

The CMOS transistor 840 is a PMOS transistor. The CMOS transistor 840 includes a source terminal, a control terminal, and a drain terminal. The source terminal of the CMOS transistor 840 is coupled to a predetermined voltage VDD. The control terminal of the CMOS transistor 840 is coupled to the inverter 815. In detail, the control terminal of the CMOS transistor 840 is configured to receive an inverted shutdown signal as a control signal to drive the CMOS transistor 840. In other words, the control terminal is coupled to a second output node of the power management circuit 800. The drain terminal is coupled to the first output node of the power management circuit 800.

The CMOS transistor 850 is a NMOS transistor. The CMOS transistor 850 includes a source terminal, a control terminal, and a drain terminal. The source terminal of the CMOS transistor 850 is coupled a ground potential VSS. The control terminal of the CMOS transistor 850 is coupled the logic circuit 820. In detail, the control terminal of the CMOS transistor 850 is configured to receive an output signal F2 as a control signal to drive the CMOS transistor 8550. The drain terminal of the CMOS transistor 850 is coupled to the drain terminal of the CMOS transistor 840. In other words, the drain terminal of the CMOS transistor 850 is coupled to the first output node of the power management circuit 800.

During a standby mode, the power transistor MP4 and the power transistor MN1 are turned on to make a first voltage VDDAI equal to a predetermined voltage VDD.

During a shutdown mode, the control signal PMP and the control signal PMN from the power management circuit 810 are turned off the power transistor MP4 and the power transistor MN1.

During a sleep mode, the control signal PMP is coupled to the first voltage VDDAI and the control signal PMN remains in logic high 1 to turn on the power transistor MN1. It is noted that, both the power transistor MN1 and the power transistor MP4 behaves as a diode during the sleep mode. In detail, a retention level of the diode may be tuned by changing the ratio of the power transistor MP4 and the power transistor MN1. The retention level of the diode becomes higher as the ratio between the power transistor MP4 and the power transistor MN1 increases. By optimizing the ratio between the power transistor MP4 and the power transistor MN1, the sleep leakage is further minimized.

Figure 9:
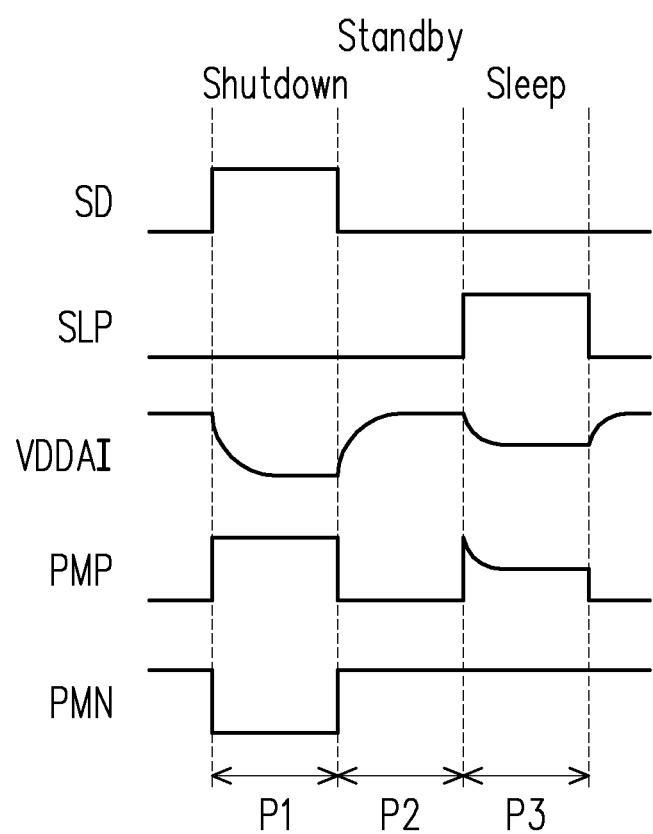
FIG. 9 illustrates a timing diagram of a memory device according to an exemplary embodiment of the disclosure.

FIG. 9 illustrates a timing diagram of a memory device according to an exemplary embodiment of the disclosure. The horizontal axis of the diagram shown in FIG. 9 illustrates the time and the vertical axis of the FIG. 9 illustrates a voltage variation corresponds to different power management modes with respect to a plurality of control signals in the memory device.

With reference to FIG. 7, FIG. 8 and FIG. 9, during a shutdown mode in a period P1, a shutdown signal SD goes from logic low 0 to logic high 1 and a sleep signal SLP remains logic low 0. In this period P1, a control signal PMP goes from logic low 0 to logic high 1 and the control signal PMN goes from logic high 1 to logic low 0 to turned off a power transistor MP4 and a power transistor MN1 and a supply voltage to the bit cell array 720 is completely cut off at this period for maximum leakage reduction. In this period P1, a data stored in the bit cell array 720 is lost.

On the other hand, during a standby mode in a period P2, the shutdown signal SD goes logic high 1 to logic low 0 and the sleep signal SLP remains logic low 0. In this period P2, the control signal PMP goes from logic high 1 to logic low 0 and the control signal PMN goes from logic low 0 to logic high 1 to turn on the power transistor MP4 and the power transistor MN1 and the supply voltage to the bit cell array 720 goes from ground potential to a predetermined voltage VDD. In other words, during the period P2, the power transistor MP4 and the power transistor MN1 are turned on to make a first voltage VDDAI equal to the predetermined voltage VDD.

During a sleep mode in a period P3, the shutdown signal SD remains in logic low 0 and the sleep signal SLP goes from logic low 0 to logic high 1. In other words, the sleep signal SLP is enabled during the period P3. After the sleep signal SLP is enabled, the control signal PMP is coupled to the first voltage VDDAI and the control signal PMN goes from logic low 0 to logic high 1. In other words, the supply voltage to the bit cell array 720 is reduced from the predetermine voltage VDD to the first voltage VDDAI by the power transistor MP4 and the power transistor MN1. In this sleep mode, both the power transistor MP4 and the power transistor MN1 behaves as a retention diode. In detail, a retention level of a diode may be tuned by changing the ratio of the power transistor MP4 and the power transistor MN1. The retention level of the diode becomes higher as the ratio between the power transistor MP4 and the power transistor MN1 increases. By optimizing the ratio between the power transistor MP4 and the power transistor MN1, the shutdown leakage is further minimized.

The truth table of the memory device is shown in Table III, with reference to FIG. 7, FIG. 9 and table III, during the shutdown mode in the period P1, the shutdown signal SD goes from logic low 0 to logic high 1 and the sleep signal SLP is undefined or remains logic low 0. It is noted that, during the shutdown mode, the power transistor MP4 and the power transistor MP5 is turned off for the maximum leakage reduction. In other words, the control signal PMP is logic high 1 and the control signal PMN is logic 0 to turn off the power transistor MP4 and the power transistor MN1.

TABLE II

| | Shutdown signal SD | Sleep signal SLP | Control signal PMP | Control signal PMN |
|---|---|---|---|---|
| Standby mode | 0 | 0 | 0 | 1 |
| Sleep mode | 0 | 1 | VDDAI | 1 |
| Shutdown mode | 1 | X | 1 | 0 |

During the standby mode in the period P2, both the shutdown signal SD and the sleep signal SLP remains logic low 0. In other words, the control signal PMP goes from logic high 1 to logic low 0 and the control signal PMP2 goes from logic low 0 to logic high 1 to turn on the power transistor MP4 and the power transistor MN1. In other words, during the period P2, the power transistor MP4 and the power transistor MN1 are turned on to make a first voltage VDDAI equal to the predetermined voltage VDD.

During the sleep mode in the period P3, the shutdown signal SD remains in logic low 0 and the sleep signal SLP goes from logic low 0 to logic high 1. In other words, the sleep signal SLP is enabled during the period P3. After the sleep signal SLP is enabled, the control signal PMP is coupled to the first voltage VDDAI and the control signal PN1 goes from logic low 0 to logic high 1. In this sleep mode, both the power transistor MP4 and the power transistor MN1 behaves as a retention diode.

Figure 10A:
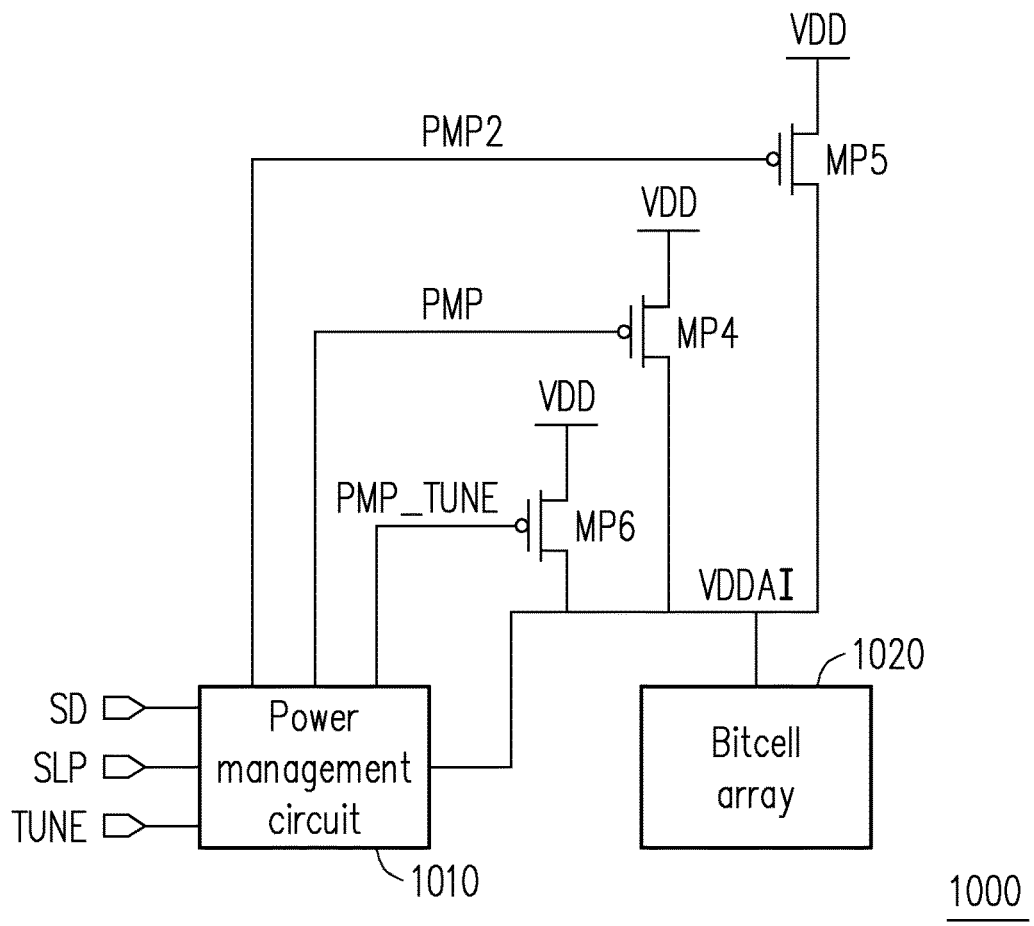
FIG. 10A illustrates a block diagram of a memory device according to an exemplary embodiment of the disclosure.

FIG. 10A illustrates a block diagram of a memory device according to an exemplary embodiment of the disclosure. The memory device 1000 includes a power management circuit 1010, a bit cell array 1020, and a power transistor MP4, a power transistor MP5, and power transistor MP6.

The power management circuit 1010 and the bit cell array 1020 are respectively similar to a power management circuit 110 and a bit cell array 120 with reference to FIG. 1, thus the detailed description of the power management circuit 1010 and the bit cell array 1020 are omitted herein.

The power transistor MP4 and the power transistor MP5 are respectively similar to the power transistor MP4 and the power transistor MP5 with reference to FIG. 4, thus the detailed description of the power transistor MP4 and the power transistor MP5 are omitted herein.

The power transistor MP6 is a PMOS transistor. The power transistor MP6 includes a source terminal, a control terminal, and a drain terminal. The source terminal of the power transistor MP6 is coupled to a predetermined voltage VDD. The control terminal of the power transistor MP6 is coupled to a third output node of the power management circuit 1010. In other words, the control terminal of the power transistor MP6 receives a control signal PMP_TUNE from the third output node of the power management circuit 1010. The drain terminal of the power transistor MP6 is coupled to the bit cell array 1020.

During a standby mode, the power transistor MP4, the power transistor MP5 and the power transistor MP6 are turned on to make a first voltage VDDAI equal to the predetermined voltage VDD. The first voltage VDDAI is the voltage after the voltage drop in the power transistor MP4, the power transistor MP5 and the power transistor MP6. In other words, the predetermined voltage VDD is greater than the first voltage VDDAI. On the other hand, the first voltage VDDAI is greater than the ground potential.

During the shutdown mode, the control signal PMP, the control signal PMP2 and the control signal PMP_TUNE from the power management circuit 1010 respectively turns off the power transistor MP4, the power transistor MP5, and the power transistor MP6.

During the sleep mode, the control signal PMP is coupled to the first voltage VDDAI. The control signal PMP2 goes to logic high. The control signal PMP_TUNE goes to logic high if a tune signal is logic high 1. On the other hand, the control signal PMP_TUNE goes to logic low 0 if the tune signal is logic low 0. To be specific, a retention level of a diode may be tuned by controlling the tune signal TUNE externally.

Figure 10B:
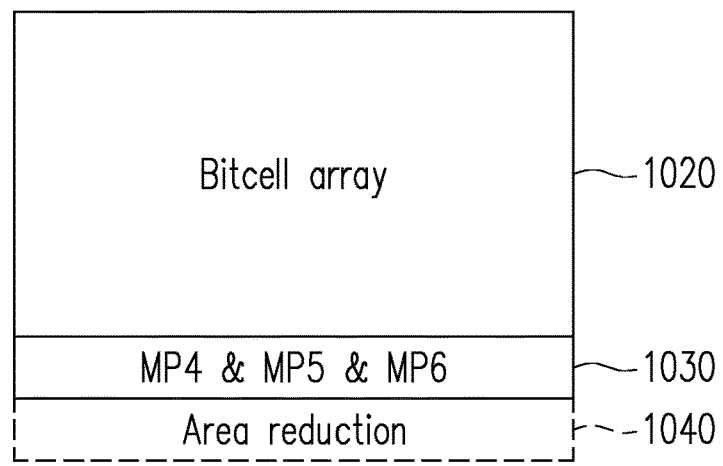
FIG. 10B illustrates a layout of a memory device according to an exemplary embodiment of the disclosure.

With reference to FIG. 10B, illustrates a layout of a memory device according to an exemplary embodiment of the disclosure. Same elements in FIG. 10B have a same reference numbers as the memory device shown in FIG. 10A. It is noted that an area of the power transistor 1050 includes the power transistor MP4, the power transistor MP5 and the power transistor MP6 with reference to FIG. 10A, thus the detailed descriptions of the bit cell array 1020 and the power transistor 1050 are omitted herein.

It is noted that, the power transistor MP4, the power transistor MP5 and the power transistor MP6 behaves as a header transistor and a retention diode by controlling the control signal PMP, the control signal PMP2, and the control signal PMP_TUNE by the power management circuit 1010 to switch between the different power management modes, thereby an area of the retention diode is reduced as shown in area reduction 1030.

Figure 11:
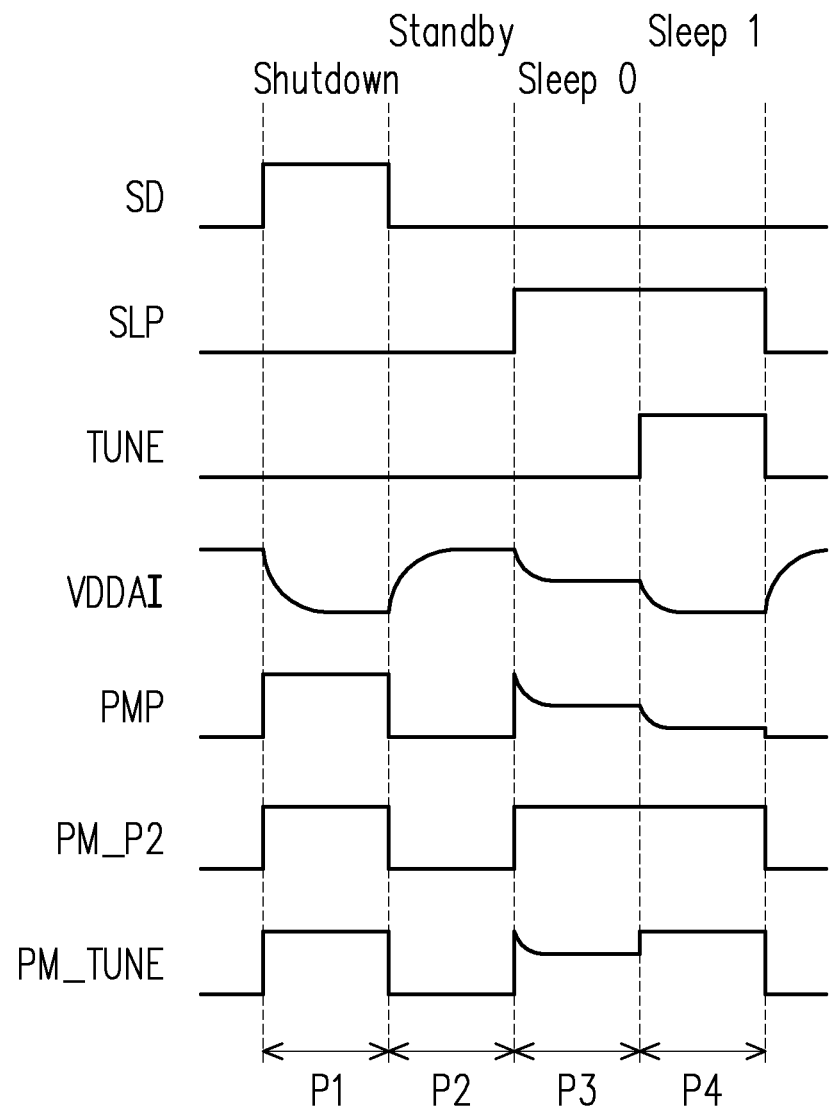
FIG. 11 illustrates a timing diagram of a memory device according to an exemplary embodiment of the disclosure.

FIG. 11 illustrates a timing diagram of a memory device according to an exemplary embodiment of the disclosure. The horizontal axis of the diagram shown in FIG. 11 illustrates the time and the vertical axis of the FIG. 11 illustrates a voltage variation corresponds to different power management modes with respect to a plurality of control signals in the memory device.

With reference to FIG. 10A and FIG. 11, during a shutdown mode in a period P1, a shutdown signal SD goes from logic low 0 to logic high 1 and a sleep signal SLP remains logic low 0. In this period P1, a control signal PMP goes from logic low 0 to logic high 1, a control signal PMP2 goes from logic low 0 to logic 1, and a control signal PMP_TUNE to turn off a power transistor MP4, a power transistor MP5, and a power transistor MP6. In the period P1 a supply voltage to the bit cell array 1020 is completely cut off at this period for maximum leakage reduction. In this period P1, a data stored in the bit cell array 1020 is lost. It is noted that a tune signal TUNE is turned off during the period P1.

On the other hand, during a standby mode in a period P2, the shutdown signal SD goes logic high 1 to logic low 0 and the sleep signal SLP remains logic low 0. In this period P2, the control signal PMP goes from logic high 1 to logic low 0, the control signal PMP2 goes from logic high 1 to logic low 0, and the control signal PMP_TUNE goes from logic high 1 to logic low 0 to turn on the power transistor MP4, the power transistor MP5, and the power transistor MP6. In the period P3 the supply voltage to the bit cell array 1020 goes from ground potential to a predetermined voltage VDD. In other words, during the period P2, the power transistor MP4, the power transistor MP5, and the power transistor MP6 are turned on to make a first voltage VDDAI equal to the predetermined voltage VDD. It is noted that a tune signal TUNE is turned off during the period P2.

During a sleep mode in a period P3, the shutdown signal SD remains in logic low 0 and the sleep signal SLP goes from logic low 0 to logic high 1. In other words, the sleep signal SLP is enabled during the period P3. After the sleep signal SLP is enabled, the control signal PMP and the control signal PMP_TUNE is coupled to the first voltage VDDAI, the control signal PMP2 goes from logic low 0 to logic high 1. In other words, the supply voltage to the bit cell array 1020 is reduced from the predetermine voltage VDD to the first voltage VDDAI by the power transistor MP4, the power transistor MP6, and the power transistor MP5. In this sleep mode, the power transistor MP4 and the power transistor MP6 behaves as a retention diode to reduce the supply voltage from the predetermine voltage VDD to the first voltage VDDAI and the power transistor MP5 behaves as a header. It is noted that a tune signal TUNE is turned off, that is logic low 0 during the period P3.

During a deep sleep mode in a period P4, the shutdown signal SD remains in logic low 0 and the sleep signal SLP remains in logic high 1. In other words, the sleep signal SLP is enabled during the period P4. After the sleep signal SLP is enabled, the control signal PMP is coupled to a second voltage VDDAI', the control signal PMP2 remains logic high 1, and the control signal goes from the VDDAI to logic high 1. In other words, the supply voltage to the bit cell array 1020 is reduced further from the first voltage VDDAI to the second voltage VDDAI' by the power transistor MP4, the power transistor MP6 and the power transistor MP5. In this deep sleep mode, the power transistor MP4 behaves as a retention diode to reduce the supply voltage from the first voltage VDDAI the second voltage VDDAI' and the power transistor MP5 and the power transistor MP6 behaves as a header.

In detail, a retention level of a diode may be tuned by changing the ratio of the power transistor MP4, the power transistor MP5, and the power transistor MP6. The retention level of the diode becomes higher as the ratio between the transistor MP4, the power transistor MP5, and the power transistor MP6 increases. By optimizing the ratio between the transistor MP4, the power transistor MP5, and the power transistor MP6, the sleep leakage is further minimized.

It is noted that, the retention level of the diode is also controlled by tuning the tune signal TUNE externally.

The truth table of the memory device is shown in Table IV, with reference to FIG. 10A, and table IV, during the shutdown mode in the period P1, a shutdown signal SD goes from logic low 0 to logic high 1 and a sleep signal SLP is undefined or remains in logic low 0. In the period P1, the control signal PMP, the control signal PMP2, and the control signal PMP_TUNE goes from logic low 0 to turned off a power transistor MP4, a power transistor MP5, and a power transistor MP6. In the period P1 a supply voltage to the bit cell array 1020 is completely cut off at this period for maximum leakage reduction.

TABLE II

|  | Shutdown signal SD | Sleep signal SLP | TUNE | Control signal PMP | Control signal PMP2 | Control signal PMP_TUNE |
| --- | --- | --- | --- | --- | --- | --- |
| Standby mode | 0 | 0 | X | 0 | 0 | 0 |
| Sleep 0 | 0 | 1 | 0 | VDDAI | 1 | VDDAI |
| Sleep 1 | 0 | 1 | 1 | VDDAI | 1 | 1 |
| Shutdown mode | 1 | X | X | 1 | 1 | 1 |

During the standby mode in the period P2, the shutdown signal SD goes logic high 1 to logic low 0, the sleep signal SLP remains logic low 0, and the tune is undefined or logic low 0. In the period P2, the control signal PMP, the control signal PMP2, and the control signal PMP_TUNE goes from logic high 1 to logic low 0 to turn on the power transistor MP4, the power transistor MP5, and the power transistor MP6. In the period P3 the supply voltage to the bit cell array 1020 goes from ground potential to a predetermined voltage VDD. In other words, during the period P2, the power transistor MP4, the power transistor MP5, and the power transistor MP6 are turned on to make a first voltage VDDAI equal to the predetermined voltage VDD.

During the sleep mode in a period P3, the shutdown signal SD remains in logic low 0 and the sleep signal SLP goes from logic low 0 to logic high 1. It is noted that the sleep mode is the period P3 is also known as sleep 0. In other words, the sleep signal SLP is enabled during the period P3. After the sleep signal SLP is enabled, the control signal PMP and the control signal PMP_TUNE is coupled to the first voltage VDDAI, the control signal PMP2 goes from logic low 0 to logic high 1. In other words, the supply voltage to the bit cell array 1020 is reduced from the predetermine voltage VDD to the first voltage VDDAI by the power transistor MP4, the power transistor MP6, and the power transistor MP5. In sleep 0, the power transistor MP4 and the power transistor MP6 behaves as a retention diode to reduce the supply voltage from the predetermine voltage VDD to the first voltage VDDAI and the power transistor MP5 behaves as a header.

During a deep sleep mode in a period P4, the shutdown signal SD remains in logic low 0 and the sleep signal SLP remains in logic high 1. It is noted that the sleep mode is the period P4 is also known as sleep 1. To be specific, the sleep signal SLP and the TUNE signal are enabled during the period P4. After the sleep signal SLP and the TUNE signal are enabled, the control signal PMP is coupled to a second voltage VDDAI', the control signal PMP2 remains logic high 1, and the control signal PMP_TUNE goes from the VDDAI to logic high 1. In other words, the supply voltage to the bit cell array 1020 is reduced further from the first voltage VDDAI to the second voltage VDDAI' by the power transistor MP4. The power transistor MP6 and the power transistor MP5 are tuned off. In the deep sleep mode, the power transistor MP4 behaves as a retention diode to reduce the supply voltage from the first voltage VDDAI the second voltage VDDAI' and the power transistor MP5 and the power transistor MP6 behaves as a header.

Figure 12:
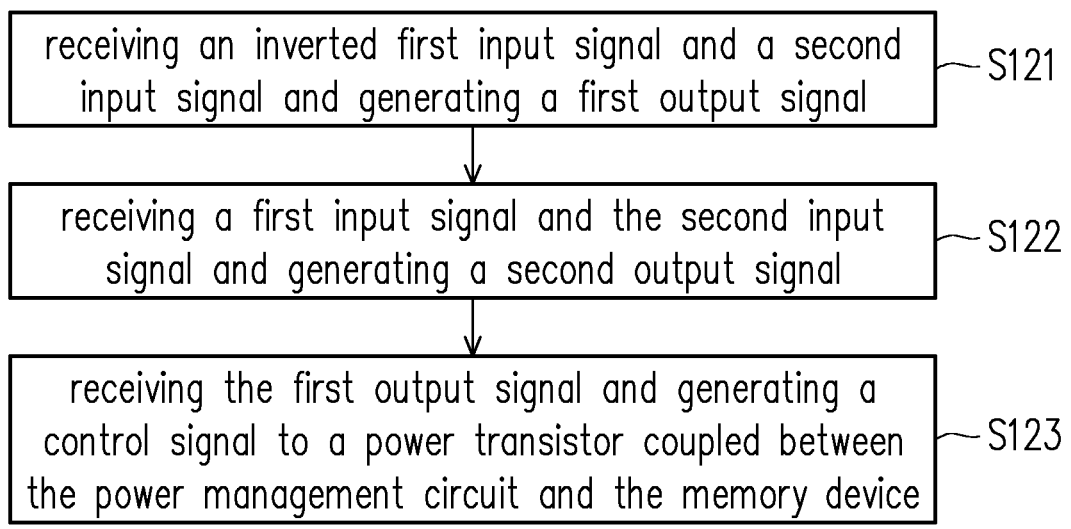
FIG. 12 illustrates a gate controlling method of a power management circuit for a memory device according to an exemplary embodiment of the disclosure.

FIG. 12 illustrates a gate controlling method of a power management circuit for a memory device according to an exemplary embodiment of the disclosure. The gate controlling method includes a step of receiving an inverted first input signal and a second input signal and generating a first input signal in step S121. In detail, with reference to FIG. 1A, FIG. 2, and FIG. 12, the logic circuit 210 is configured to an inverted shut down signal SD' and a sleep signal SLP to generate an output signal F1. It is noted that the inverted first input signal is the inverted shut down signal SD' and the second input signal is the sleep signal SLP. The logic circuit 210 is a 2-input NAND gate.

In step S122, receiving a first input signal and the second input signal and generating a second output signal. In other words, a logic circuit 220 is configured to receive a shutdown signal SD and the sleep signal SLP to generate an output signal F2. It is noted that the first input signal is the shutdown signal SD. The logic circuit 220 is a 2-input NOR gate.

In step S123, receiving the first output signal and generating a control to a power transistor coupled between the power management circuit and the memory device. To be specific, a transmission gate 230 is configured to receive the first output signal F1 and generates a control signal PMP to a power transistor MP4. It is noted that during a standby mode, the power transistor MP4 is turned on to make a first voltage VDDAI equal to a predetermined voltage. The first voltage VDDAI is the voltage after a voltage drop in the power transistor MP4. In other words, the predetermined voltage VDD is greater than the first voltage VDDAI and the first voltage VDDAI is greater than a ground potential. By this method, the power transistor behaves as a header transistor and a retention diode by controlling the control signal by the power management circuit to switch between the different power modes, the area of the retention diode is reduced. Thus, the area overhead of the memory device is reduced.

According to some embodiments, the disclosure provides a power management circuit suitable for a memory device. The power management circuit includes a first logic circuit, a second logic circuit, and a transmission gate. The first logic circuit is configured to receive an inverted first input signal and a second input signal and generates a first output signal. The second logic circuit is configured to receive a first input signal and the second input signal and generates a second output signal. The transmission gate is configured to receive the first output signal and generates a control signal to at least one power transistor coupled between the power management circuit and the memory device. During a standby mode, the power transistor is turned on to make a first voltage equal to a predetermined voltage and during a sleep mode, the control signal is coupled to a first voltage. The predetermined voltage is greater than the first voltage.

According to some embodiments, the disclosure provides a memory device. The memory device includes a bit cell array, at least one power transistor, and a power management circuit. The bit cell array includes a plurality of bit cells in the memory device. The power management circuit includes a first logic circuit, a second logic circuit, and a transmission gate. The first logic circuit is configured to receive an inverted first input signal and a second input signal and generates a first output signal. The second logic circuit is configured to receive a first input signal and the second input signal and generates a second output signal. The transmission gate is configured to receive the first output signal and generates a control signal to at least one power transistor coupled between the power management circuit and the memory device. During a standby mode, the power transistor is turned on to make a first voltage equal to a predetermined voltage and during a sleep mode, the control signal is coupled to a first voltage. The predetermined voltage is greater than the first voltage.

According to some embodiments, the disclosure provides a gate controlling method of a power management circuit for a memory device. The method includes the step of: receiving an inverted first input signal and a second input signal and generating a first output signal; receiving a first input signal and the second input signal and generating a second output signal; and receiving the first output signal and generating a control signal to a power transistor coupled between the power management circuit and the memory device. During a standby mode, the power transistor is turned on to make a first voltage equal to a predetermined voltage and during a sleep mode, the control signal is coupled to a first voltage. The predetermined voltage is greater than the first voltage.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A power management circuit suitable for a memory device comprising:
   a first logic circuit, configured to receive an inverted first input signal and a second input signal and generates a first output signal;
   a second logic circuit, configured to receive a first input signal and the second input signal and generates a second output signal; and
   a transmission gate, configured to receive the first output signal and generates a control signal to at least one power transistor coupled between the power management circuit and the memory device,
   wherein during a standby mode, the power transistor is turned on to make a first voltage equal to a predetermined voltage and during a sleep mode, the control signal is coupled to a first voltage,
   wherein the predetermined voltage is greater than the first voltage.

2. The power management circuit of claim 1, wherein during a shutdown mode, the control signal turns off the power transistor.

3. The power management circuit of claim 1, wherein the first voltage is greater than a ground potential.

4. The power management circuit of claim 1, further comprising:
   a first inverter, coupled with the first logic circuit receives the first input signal and generates the inverted first input signal; and
   a second inverter, coupled with the first logic circuit receives the first output signal and generates an inverted first output signal.

5. The power management circuit of claim 1, further comprising:
   a first transistor, comprising a first terminal, a second terminal and a control terminal,
   wherein the first terminal of first transistor is coupled to the predetermined voltage and the control terminal receives the inverter first input signal, and
   the control terminal of the second transistor receives the second output signal and the first terminal of the second transistor is coupled to the second terminal of the first transistor; and
   a second transistor, comprising a first terminal, a second terminal and a control terminal,
   wherein the first terminal of the second transistor and the second terminal of the first transistor are coupled to an output node provides the control signal to the power transistor.

6. The power management circuit of claim 1, further comprising:
   a third inverter, configured to the receive the second output signal and generates a second control signal to a second power transistor.

7. The power management circuit of claim 6, wherein the second power transistor is a PMOS transistor.

8. The power management circuit of claim 1, wherein an inverted first input signal is a control signal for a second power transistor.

9. The power management circuit of claim 8, wherein the second power transistor is a NMOS transistor.

10. The power management circuit of claim 5, wherein the power management circuit receives a third input signal and generates a control signal for a third power transistor.

11. The power management circuit of claim 10, wherein the third power transistor is a PMOS transistor.

12. A memory device comprising:
    a bit cell array, comprises a plurality of bit cells in the memory device;
    at least one power transistor; and
    a power management circuit comprises:
      a first logic circuit, configured to receive an inverted first input signal and a second input signal and generates a first output signal;
      a second logic circuit, configured to receive a first input signal and the second input signal and generates a second output signal; and
      a transmission gate, configured to receive the first output signal and generates a control signal to at least one power transistor coupled between the power management circuit and the memory device,
      wherein during a standby mode, the power transistor is turned on to make a first voltage equal to a predetermined voltage and during a sleep mode, the control signal is coupled to a first voltage,
      wherein the predetermined voltage is greater than the first voltage.

13. The memory device of claim 12, wherein during a shutdown mode, the control signal turns off the power transistor.

14. The memory device of claim 12, wherein the first voltage is greater than a ground potential.

15. The memory device of claim 12, wherein the power management circuit further comprising:
    a first transistor, comprising a first terminal, a second terminal and a control terminal,
    wherein the first terminal of first transistor is coupled to the predetermined voltage and the control terminal receives the inverter first input signal, and
    the control terminal of the second transistor receives the second output signal and the first terminal of the second transistor is coupled to the second terminal of the first transistor; and
    a second transistor, comprising a first terminal, a second terminal and a control terminal,
    wherein the first terminal of the second transistor and the second terminal of the first transistor are coupled to an output node provides the control signal to the power transistor.

16. The memory device of claim 12, further comprising:
    a first inverter, coupled with the first logic circuit receives the first input signal and generates the inverted first input signal; and
    a second inverter, coupled with the first logic circuit receives the first output signal and generates an inverted first output signal.

17. The memory device of claim 12, wherein the power management circuit further comprising:
    a third inverter, configured to the receive the second output signal and generates a second control signal to a second power transistor.

18. The memory device of claim 17, wherein the second power transistor is a PMOS transistor.

19. The memory device of claim 12, wherein an inverted first input signal is a control signal for a second power transistor, and the second power transistor is a NMOS transistor.

20. A gate controlling method of a power management circuit for a memory device comprising:
- receiving an inverted first input signal and a second input signal and generating a first output signal;
- receiving a first input signal and the second input signal and generating a second output signal; and
- receiving the first output signal and generating a control signal to a power transistor coupled between the power management circuit and the memory device,
- wherein during a standby mode, the power transistor is turned on to make a first voltage equal to a predetermined voltage and during a sleep mode, the control signal is coupled to a first voltage,
- wherein the predetermined voltage is greater than the first voltage.

* * * * *